United States Patent [19]

Miyamoto et al.

[11] Patent Number: 4,672,346

[45] Date of Patent: Jun. 9, 1987

[54] MAGNETIC FIELD GENERATING DEVICE FOR NMR-CT

[75] Inventors: Toshinobu Miyamoto; Hideya Sakurai; Hiroo Hayashi; Youichi Ohnishi, all of Osaka, Japan

[73] Assignee: Sumotomo Special Metal Co., Ltd., Osaka, Japan

[21] Appl. No.: 719,820

[22] Filed: Apr. 4, 1985

[30] Foreign Application Priority Data

| Apr. 11, 1984 | [JP] | Japan | 59-95075 |
| Apr. 11, 1984 | [JP] | Japan | 59-95076 |
| Apr. 11, 1984 | [JP] | Japan | 59-53575[U] |
| Apr. 11, 1984 | [JP] | Japan | 59-53576[U] |
| Jun. 1, 1984 | [JP] | Japan | 59-113713 |
| Nov. 15, 1984 | [JP] | Japan | 59-173377[U] |
| Nov. 15, 1984 | [JP] | Japan | 59-173378[U] |
| Feb. 9, 1985 | [JP] | Japan | 60-17418[U] |
| Dec. 3, 1985 | [JP] | Japan | 60-35708[U] |
| Dec. 3, 1985 | [JP] | Japan | 60-35710[U] |

[51] Int. Cl.$^4$ ............................................. H01F 7/00
[52] U.S. Cl. ...................... 335/296; 335/298; 335/300
[58] Field of Search .............. 335/296, 297, 298, 300, 335/301, 302, 306; 324/318, 320

[56] References Cited

U.S. PATENT DOCUMENTS

| 2,777,099 | 1/1957 | Foss | 335/297 |
| 4,445,102 | 4/1984 | Thorn et al. | 335/297 |
| 4,498,048 | 2/1985 | Lee et al. | 324/307 |

FOREIGN PATENT DOCUMENTS

| 59-61763 | 4/1984 | Japan | 335/306 |
| 59-501995 | 11/1984 | Japan | 335/306 |

*Primary Examiner*—George Harris
*Attorney, Agent, or Firm*—Watson, Cole, Grindle & Watson

[57] ABSTRACT

A magnetic field generating device for a nuclear magnetic resonance-computerized tomography comprising a pair of permanent magnets magnetized in the same direction with different-polarity poles opposing mutually to define an air gap, whose maximum energy product, $(BH)_{max}$, is not less than 30 MGOe (240 KJ/m$^3$), on each of the opposing faces of the permanent magnets a magnetic pole segment being provided which has an annular projection and, as occasion demands, at least one central convex projection inside the annular projection, and the permanent magnets being coupled magnetically by a yoke to generate a magnetic field within the air gap.

The present device is able to create a uniform and stable magnetic field, in spite of its small-sized body.

26 Claims, 28 Drawing Figures

MAGNETIC FIELD GENERATING DEVICE FOR NMR-CT

BACKGROUND OF THE INVENTION

1. Field of the Invention

This invention relates to a magnetic field-generating device which employs a permanent magnet and which can generate a powerful, accurate and uniform magnetic field in a large air gap, and more particularly to a magnetic field-generating device which can be used for nuclear magnetic resonance-computerized tomography (hereinafter referred to as NMR-CT) so as to obtain a sectional image of an object subjected to medical examination and picture the properties of tissue.

2. Description of the Prior Art

In order to obtain a desired tomographic image of a human body by placing all or part of the body in an air gap where a strong magnetic field on the order of 1–10 KG (0.1–1 T) is created, a uniformity and stability on the order of $10^{-4}$ or less are required. As the magnetic field generating device for NMR-CT, a device is known which includes a resistive electromagnet composed of cylindrically wound copper or aluminum coils. Another known device includes a superconducting magnet which is cooled to near the temperature of liquid Helium and is composed of special conductor coils.

The former device, due to its structure, is low-priced; however, in order to generate a sufficiently strong magnetic field, it consumes huge amounts of electric power and cooling water. As such, its operating cost is high, and its available field strength is practically limited to around 0.15–0.20 T. On the other hand, the superconducting magnet of the latter device has the advantage that it can generate a stronger magnetic field with little power consumption, but its price is much higher than that of the usual conductor; furthermore, the use of costly liquid Helium, is indispensable to achieving a super conducting condition. As such, the total cost of the device is too expensive to be widely used for medical applications.

In comparison with the foregoing, a magnetic device field-generating device employing a permanent magnet was suggested by OMR Co. and FONAR Co. in the RSNA in December, 1982. This suggested device, however, weighs about 100 tons, which is too heavy for usual hospital usage.

There has also been proposed an alternative device wherein a pair of circular ring-like permanent magnets which are magnetized in the axial direction and which are spaced apart and oriented such that the facing sides have opposite polarities (see JA-OS No. 61763/59, laid open for public inspection on Apr. 9, 1984), and a device wherein plural trapezoidal permanent magnets are arranged annularly (see JA-OS No. 501995/59, laid open for public inspection on Nov. 29, 1984). The former device is desirable as far as costs are concerned, but its leakage flux is large because it creates a magnetic field similar to that of the resistive electromagnet. On the other hand, the latter device is believed to be too complex in shape and too difficult to assemble for it to be a desirable system.

Although the permanent magnet device has been believed a truly ideal system for NMR-CT application, there have not been any actual devices which can provide the advantages of a permanent magnet due to the lack of enough strong material and sufficiently advanced design technology.

SUMMARY OF THE INVENTION

It is a first object of the present invention to provide an actual device for NMR-CT which employs a permanent magnet as a magnetic field generating source and which can create highly uniform, and stable magnetic field within a required air gap.

It is a second object of the present invention to provide such a device which includes an adjusting mechanism in order to control the uniform, stable magnetic field.

It is a third object of the present invention to provide a device which is small in size and excellent in practicability and which employs an effectively arranged permanent magnet of excellent magnetic properties.

According to the present invention, the structure includes a pair of permanent magnets which are magnetized in the same direction and are positioned with different-polarity poles opposing mutually to define a gap, a magnet pole segment having an annular projection or a magnetic pole segment having an annular projection and at least one convex projection provided inside the annular projection and having the same center as of the annular projection is provided on each of the opposing faces of the permanent magnets, and the pair of permanent magnets are composed magnetically together by a yoke to generate a magnetic field within the gap.

The invention will be better understood by reference to the attached drawings, taken in conjunction with the following discussion.

DESCRIPTION OF THE PREFERRED EMBODIMENTS

The embodiments of the present invention will be described with reference to FIGS. 1 through 15, in which the identical portions bear the same reference numbers.

Figure 1A:
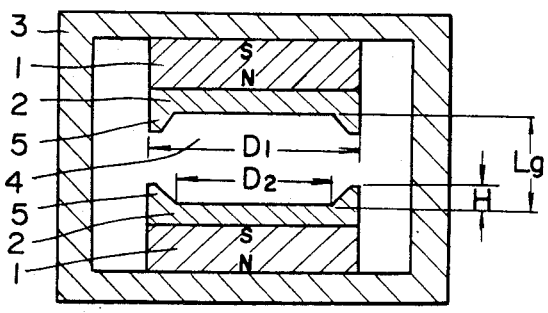
FIG. 1A is an explanatory view of a magnetic field generating device for use in an NMR-CT device which is constructed according to a first embodiment of the present invention.
Figure 1B:
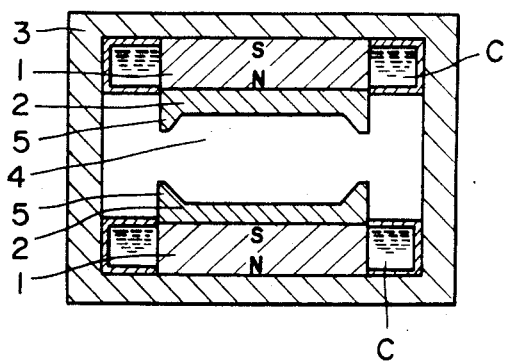
FIGS. 1B and 1C are views showing other embodiments of the invention.

FIG. 1A is an explanatory view of a magnetic field-generating device for use in an NMR-CT device and which is constructed according to a first embodiment of the present invention. It includes a pair of permanent magnets 1, 1 which are magnetized in the same direction and which are positioned so that their different-polarity poles are opposing mutually as to form an air gap 4 therebetween. On the respective opposing faces magnetic pole segments 2, 2 are provided, each segment having an annular projection 5. A yoke 3 is provided to magnetically couple the permanent magnets 1, 1 and enable a magnetic field of 1-10 kG (0.1-1 T) in strength to be generated within the air gap 4. Medical examination can be performed by bringing the whole or a part of a human body into the air gap 4.

Although ferrite magnets, Alunico magnets, or rare earth cobalt magnets can be used for the permanent magnets 1, 1, Fe-B-R series permanent magnets (R being at least one of the rare earth elements, inclusive of Y) which are permanent magnets of excellent property (previously suggested by the present applicant see Japanese Patent Application No. 57-145072) can be used. These magnets do not use costly Sm and Co and have a maximum energy product of a large value and a temperature characteristic whose temperature coefficient of residual flux density (Br) is $-0.07\%/°C.--0.15\%/°C$. thus, such permanent magnets, when cooled especially to below 0° C., can produce a remarkably high energy and can be utilized effectively. In order to cool down the permanent magnets 1, 1, a refrigerant C which is a combination of alcohol-benzene and dry ice, other than liquid nitrogen, may be provided on both side end faces.

R (provided that R is at least one of the rare earth elements inclusive of Y) of 8-30 atomic percent, B of 2-28 atomic percent, and Fe of 42-90 atomic percent, whose principal phase is of the tetragonal system. This permanent magnet is a very good magnet showing a very large maximum energy product on the order of 30 MGOe (240 kJ/m$^3$) or more by inclusion of R (out of the light rare earth element group which is one of the rich resources, inclusive of Nd and Pr), B and Fe as the principal component.

Because of the large air gap and high field requirement in operation, one pair of permanent magnets weighs over 100 kG even if the foregoing Fe-B-R series permanent magnet is employed. As such, it is difficult to construct the device using segments of only one permanent magnet. Generally, a considerable number of the segments are built into one block of magnet by a so-called magnetizing/assembling process comprising the steps of individually magnetizing plural prism-like permanent magnets and then assembling them into one unit. The form of the magnet may take any shape, such as circular disk-like or square plate-like, and may be selected appropriately depending upon the magnetic characteristic, the extent of the air gap 4, etc.

Each of the paired magnetic pole segments 2 has an outer diameter of $D_1$ and is formed at its peripheral shim with an annular projection 5 of $D_2$ in inner diameter and H in height. By making them oppose to each other the uniformity of the magnetic field in the air gap 4 can be improved dramatically. If the inner face of the annular projection 5 is an inclined plane expanding upward, further improvement in uniformity can be obtained.

Figure 2A:
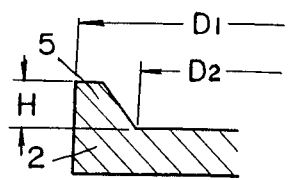
FIGS. 2A through 2D are enlarged sectional views showing embodiments of a magnetic pole segment.
Figure 2B:
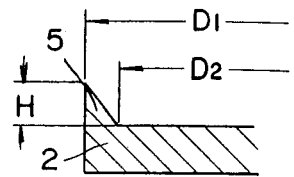
Figure 2C:
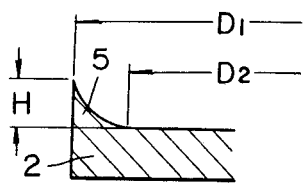
Figure 2D:
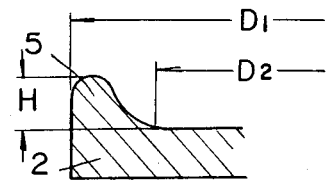

FIGS. 2A through 2D are vertical sectional views illustrating various types of magnetic pole segments 2. In particular, FIG. 2A illustrates a trapezoid cross section, FIG. 2B illustrates a triangular cross section, FIG. 2C illustrates a triangular cross section wherein the inner inclined face is curved, and FIG. 2D illustrates a trapezoidal cross section whose corner portions have been chamfered to provide a curved face, for example. The shape and size of the annular projection may also be selected appropriately depending upon the size and magnetic characteristic of the permanent magnet and the extent of air gap. Specifically, the following range is effective:

$$D_2 \geq \tfrac{1}{3} \cdot D_1.$$

$$H \leq \tfrac{1}{4} \cdot L_g$$

where $D_1$ is the magnetic pole segment outer diameter, $D_2$ is the annular projection inner diameter, $L_g$ is the air gap, and H is the height of the annular projection.

Figure 3A:
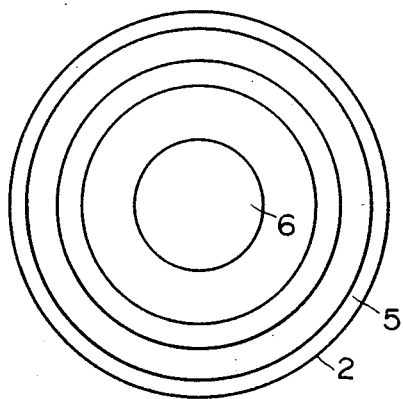
FIGS. 3A through 3C are plane views showing other embodiments of the magnetic pole segment.
Figure 3B:
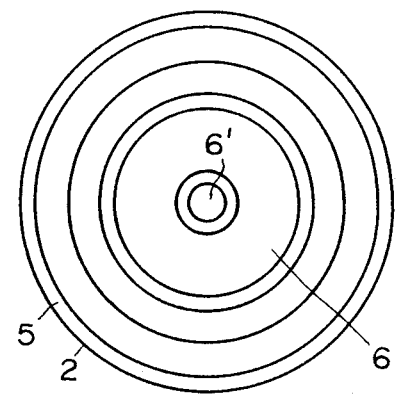
Figure 3D:
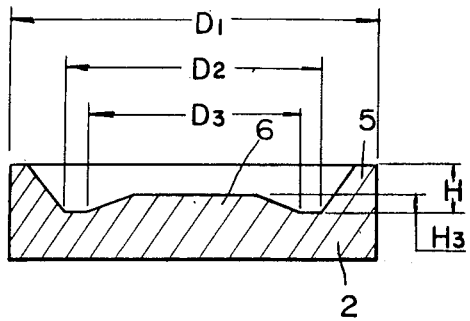
FIGS. 3D through 3F are central sectional views corresponding to FIGS. 3A through 3C, respectively.
Figure 3E:
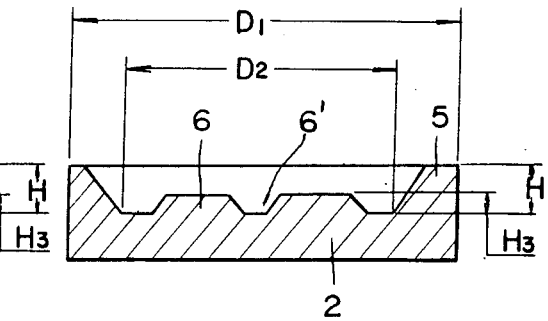
Figure 3C:
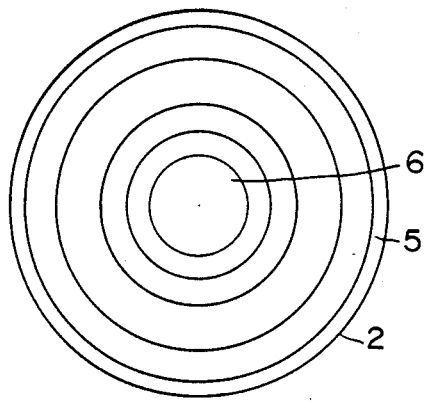
Figure 3F:
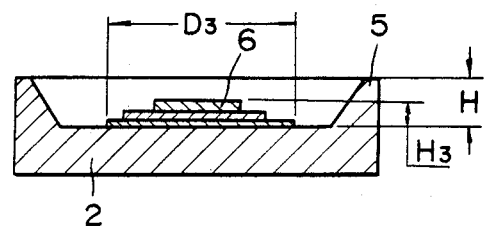

FIGS. 3A through 3C illustrate further improved magnetic pole segments, each having an annular projection and a central convex projection 6 provided inside the annular projection and having the same center as of the annular projection.

The convex projection may be selected appropriately from such as a projection previously formed integrally on the upper face of the magnetic pole segment, a board-like iron plate bonded on the opposing face of the magnetic pole segment, a disk-like or square shape-like body, or those divided into plural pieces.

FIG. 3A illustrates a disk-like convex projection 6 of a substantial trapezoid cross section having an outer diameter $D_3$ and a height $H_3$, previously formed integrally on the opposing face of the magnetic pole segment 2. FIG. 3B illustrates a disk-like convex projection 6 of a substantial trapezoid section forming a recess 6' on the upper face thereof, previously formed to have the same center as of the annular projection 5 and integrally on the opposing face of the magnetic pole segment 2. The convex projection may include two or more recesses 6' having the same centers as of the annular projection on the upper face. FIG. 3C illustrates a convex projection 6 composed of plural disks of different diameters positioned on one another, each having the same center as the annular projection 5 and having an outermost diameter $D_3$ and a total height $H_3$ and positioned in the center portion. Though in FIGS. 3A through 3C the annular projection 5 is shown to have a trapezoid cross section, the annular projection 5 can have any shape, for example, a triangular cross section and be combined effectively with any of the foregoing convex projections 6 as to give a desired function.

The shape and size of the convex projection and annular projection may also be selected appropriately depending upon the size and magnetic characteristic of the permanent magnet and the extent of the air gap. Specifically, the following range is effective:

$$D_2 \geqq \tfrac{1}{2} \cdot D_1,$$

$$H \leqq \tfrac{1}{4} \cdot L_g$$

$$H_3/H = 1/100 \sim \tfrac{1}{4}$$

where $D_1$ is the magnetic pole segment outer diameter, $D_2$ is the annular projection inner diameter, Lg is the gap, H is the height of the annular projection, and $H_3$ is the height of the convex projection.

The yoke 3 must be selected so as to realize most effectively formation of the magnetic path including the pair of permanent magnets 1, 1 and so as to reduce the device weight.

Figure 4A:
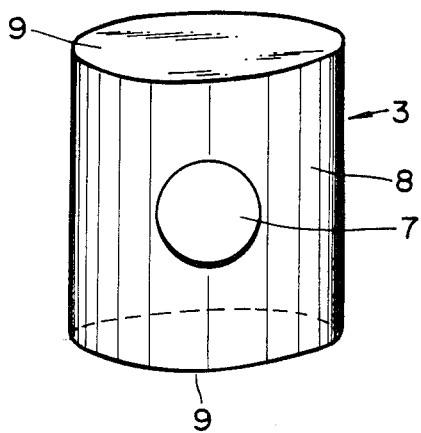
FIGS. 4A through 4C are perspective views showing embodiments of a yoke.
Figure 4B:
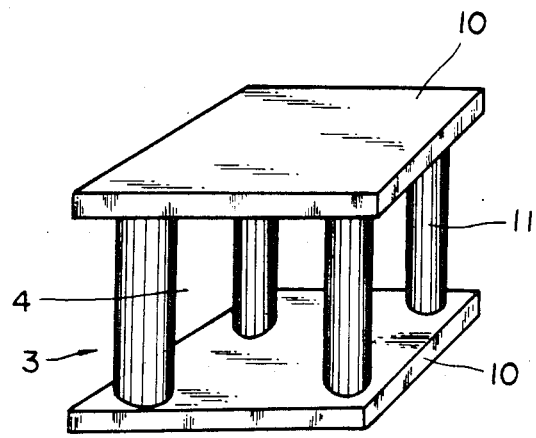
Figure 4C:
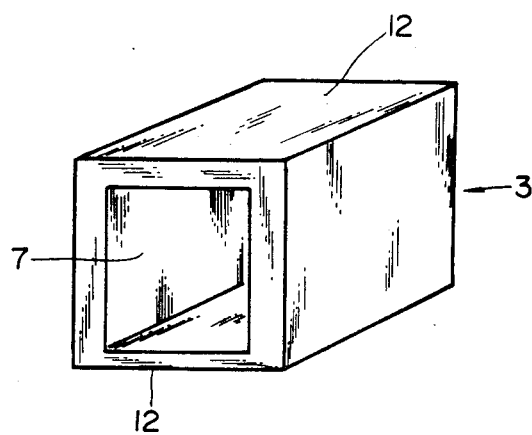

FIGS. 4A through 4C illustrate embodiments of the yoke 3. Specifically, the yoke shown in FIG. 4A comprises a cylinder-like yoke portion 8 having an opening 7 for permitting the examination object to be brought into the air gap, and disk-like yoke portions 9, 9 positioned at the top and bottom of the cylinder-like yoke portion 8 each of which supports one of the paired permanent magnets on its inner face, thus, this yoke assembly is in the form of a cylinder shape with top and bottom. Accordingly, because the air gap within which the magnetic field is created is surrounded by the cylinder-like yoke portion 8, there appears little leakage flux spreading outward from the device, and the advantages of the magnetic field generating device employing a permanent magnet can be maximized.

The yoke shown in FIG. 4B has the structure in which two plate-like yoke portions 10, 10 are positioned in opposition to each other and coupled together by plural rod-like yoke portions 11, and on the inner face of each plate-like yoke portion 10 the permanent magnet is provided. Thus, the examination object can be brought into the air gap 4 where the magnetic field is created, through between the rod-like yoke portions 11 along any directions (the four directions in the illustrated embodiment), accordingly, manipulation, maintenance and management of any magnetic field adjusting mechanisms hereinafter described, as well as assembling of the device, can be performed easily.

The plate-like yoke portion 10 is preferably made in the form of a square plate shape, disk plate shape, etc., depending upon the shape of the permanent magnet. Further, the shape and number of the rod-like yoke portions 11 are desirably determined such that no saturation of the flux in the inside of the rod-like yoke portion 11 is caused.

The yoke shown in FIG. 4C is composed of a quadrilateral frame body formed with an opening 7 in the direction of inserting the examination object. The pair of permanent magnets are provided on the inner faces of the upper and lower plate portions 12, 12.

In the following descrition of the embodiments in reference to FIG. 1A and so forth, the yoke 3 is assumed as having the form of a cylinder shape with top and bottom.

In the magnetic field generating device shown in FIG. 1A, it is possible to improve the strength of magnetic field within the air gap 4 by converging positively the leakage flux originating from the pair of magnetic pole segments 2, 2 into the air gap 4, thus, this also contributes to miniaturization of the device. In order to realize the above, the structures shown in FIGS. 5 through 7 are presented.

Figure 5:
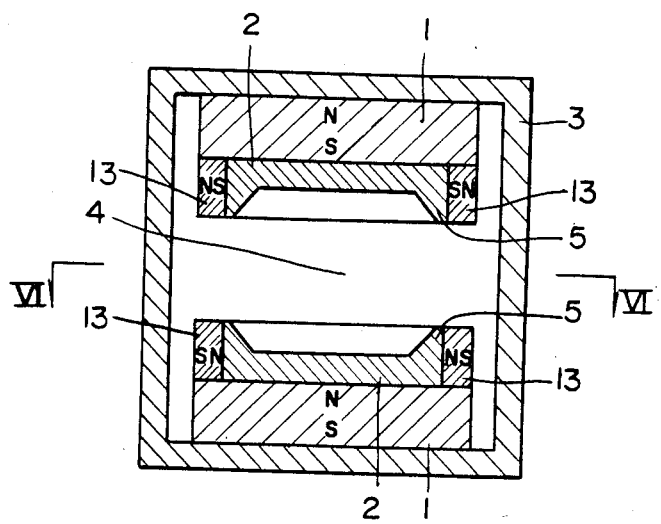
FIG. 5 is a central vertical sectional view showing a means for increasing the strength of the magnetic field in the magnetic field-generating device.
Figure 6:
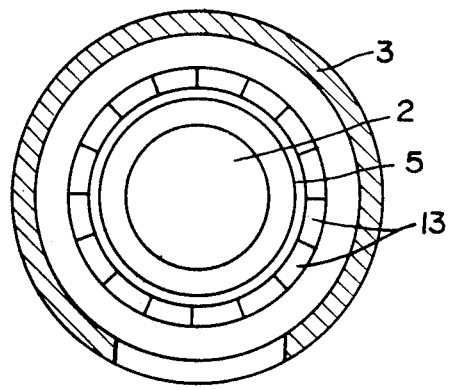
FIG. 6 is a sectional view taken along line VI—VI in FIG. 5.

In FIGS. 5 and 6, on the outer periphery of the annular projection 5 of the magnetic pole segment 2, an annular permanent magnet 13 for repelling the leakage flux which is made up of plural bow-like permanent magnets is provided. Accordingly, the magnetic flux originating from the magnetic pole segments 2, 2 is converged in the same direction as the magnetizing direction of the permanent magnets 1, 1 by means of the annular projection 5 and the leakage flux-repelling permanent magnet 13 provided on the outer periphery of the former, thereby creating a magnetic field, so that the leakage flux decreases and the magnetic field of a very high degree of uniformity is obtained within the air gap 4.

As described hereinafter, the same effect as that described hereinabove can be obtained if the leakage flux-repelling permanent magnet is positioned at appropriate spots on the inner peripheral face of the yoke 3, for example, at a location opposing to the outer peripheral face of each magnetic pole segment 2, or at a location opposing to the center portion of the air gap 4.

Figure 7:
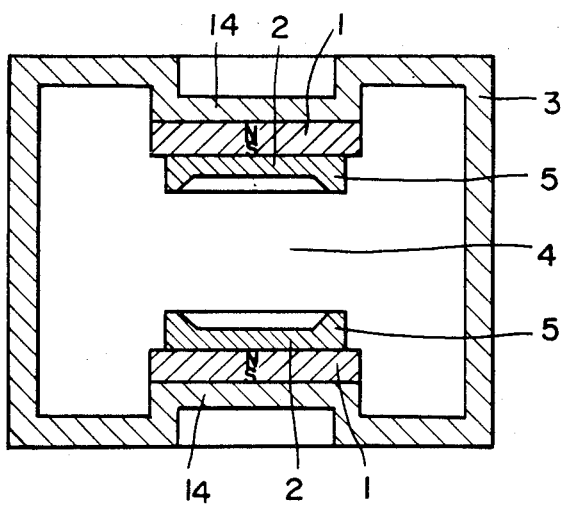
FIG. 7 is a central vertical sectional view showing another embodiment of the means shown in FIG. 5.

The structure shown in FIG. 7 is characterized in that each permanent magnet-receiving portion 14 of the yoke 3 is projected toward the air gap 4 so as to form a convex portion, but as not causing at least each yoke face portion where the permanent magnet 1 is provided to come close to the periphery of the magnetic pole segment 2, thus, this structure can also improve the strength of magnetic field within the air gap 4 as is the above case.

Further, in the magnetic field-generating device of the present invention, by the use of the magnetic field-adjusting mechanism described hereinafter, a further uniform, stable magnetic field can be obtained, and maintenance and management becomes more easy.

Figure 8:
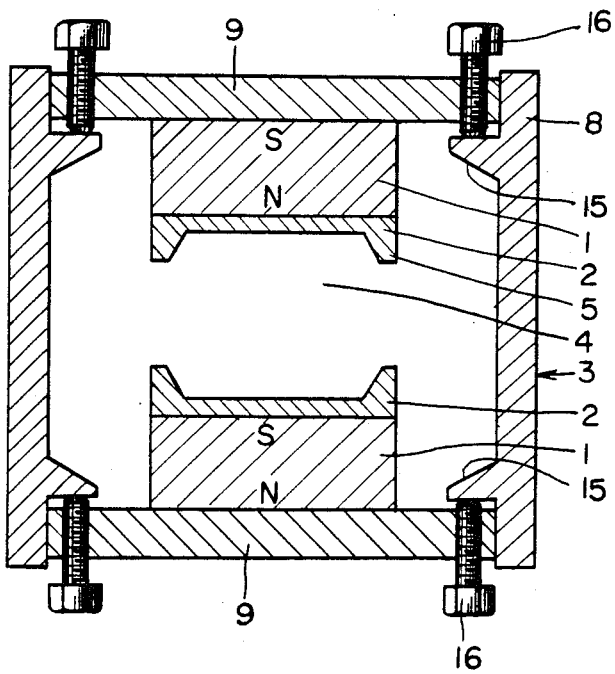
FIG. 8 is a sectional view showing the inventive magnetic field-generating device equipped with an adjusting mechanism to make variable the distance between a pair of magnetic pole segments.

FIG. 8 illustrates the structure including the adjusting mechanism which makes variable the distance between the paired mutually opposing magnetic pole segments 2, 2. In this drawing, the yoke 3 is composed of the two disk-like yoke portions 9 on which the permanent magnets 1 are provided and the cylinder-like yoke portion 8 for coupling magnetically the disk-like yoke portions 9. Each disk-like yoke portion 9 is positioned in a respective upper and lower opening of the cylinder-like yoke portion 8, and on the inner marginal peripheral face of each upper/lower opening of the cylinder-like yoke portion 8 a marginal projection 15 is formed. Adjusting bolts 16 threaded through the plane marginal portion of the disk-like yoke portion 9 at a regular interval abut at their points on the associated marginal projection 15 to support the fitted disk-like yoke portion 9. By turning the bolts 16 the disk-like yoke portion 9 moves in the axial direction of the cylinder-like yoke portion 8, whereby the distance between the magnetic pole segments 2, 2 attached to the points of the permanent magnets 1, 1 can be adjusted. This adjusting mechanism is also effective in finely adjusting the degree of parallelism of the pair of mutually oppposing magnetic pole segments 2, 2.

By adjusting the distance between the paired magnetic pole segments 2, 2 in the vertical direction as viewed in the drawing, the substantial action of the magnetic flux originating from the permanent magnets 1, 1 on the gap can be regulated, and the extent of flux generation into the air gap 4 is uniformed and magnified, an excellently uniform magnetic field can be obtained stably.

In the foregoing magnetic field-adjusting mechanism, if the extent of variation in the distance between the magnetic pole segments is set large, a large-sized adjusting mechanism is needed because the weight of the magnet is heavy, and the cutting contact surface on the yoke becomes too large, so undesirable. If the extent of variation is set too short, there is little effect in obtaining the uniform magnetic field. Accordingly, the extent of variation is preferable when it is in the range of 0.1%–10% of the set, designed distance between the opposing faces. Though other adjusting mechanism, for example, changing the length of the yoke which couples magnetically the opposing magnetic pole segments, and forms and maintains the air gap, can be employed, a mechanism whose influences on respective magnetic pole segments are magnetically equivalent in the magnetic circuit including that mechanism is most desirable. Thus, the adjusting mechanism should desirably be selected appropriately depending upon the magnetic characteristic, shape and size of the permanent magnet, the size and shape of the yoke, the air gap size, etc.

Figure 9:
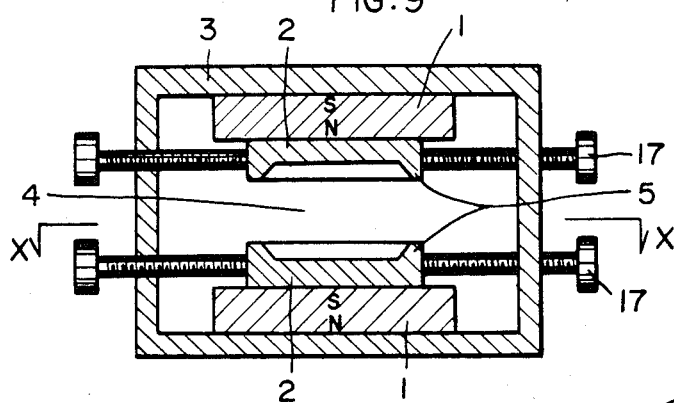
FIG. 9 is a central vertical sectional view showing another embodiment of the magnetic field-adjusting mechanism.
Figure 10:
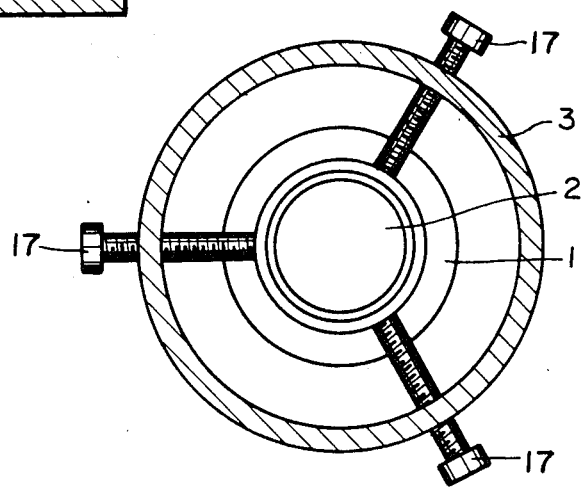
FIG. 10 is a sectional view taken along line X—X in FIG. 9.

The magnetic field-adjusting mechanism shown in FIGS. 9 and 10 is characterized in that the pair of mutually opposing magnetic pole segments 2, 2 are permitted to move relatively parallelly with respect to the opposing plane or face. In these drawings, nonmagnetic moving-extent adjusting bolts 17 are threaded from the outer periphery of the yoke 3, at three spots, spaced by 120°, of the yoke 3 opposing to the outer periphery of each magnetic pole segment 2, therethrough toward the center. By turning any of the moving-extent adjusting bolts 17 each magnetic pole segment 2 is moved in the direction parallel to the opposing faces of the paired magnetic pole segments, or the magnetic pole segments 2 can move relatively parallelly.

In the foregoing structure, if, for example, one magnetic pole segment 2 is fixed and the other magnetic pole segment 2 is moved by turning the three moving-extent adjusting bolts 17 as to cause a little disagreement between the opposing center lines of the paired magnetic pole segments, a magnetic field uniformed excessively in the horizontal direction is obtained within the air gap 4.

Besides the foregoing structure, several types of adjusting mechanisms can be employed in correspondence to the structure of the magnetic circuit, but a mechanism whose influences on respective magnetic pole segments are magnetically equivalent in the magnetic circuit including that mechanism is desirable. Thus, the adjusting mechanism should desirably be selected appropriately depending upon the magnetic characteristic, shape and size of the permanent magnet, the shape and size of the yoke, the extent of the air gap, etc.

However, if the extent of relative and parallel movement of the magnetic pole segments becomes larger than necessary, this causes several problems such that the adjusting mechanisms becomes large in size and complicated, and the magnetic balance is broken. Thus, the extent of parallel movement is preferably 2% or less of the magnetic pole segment outer diameter.

Figure 11:
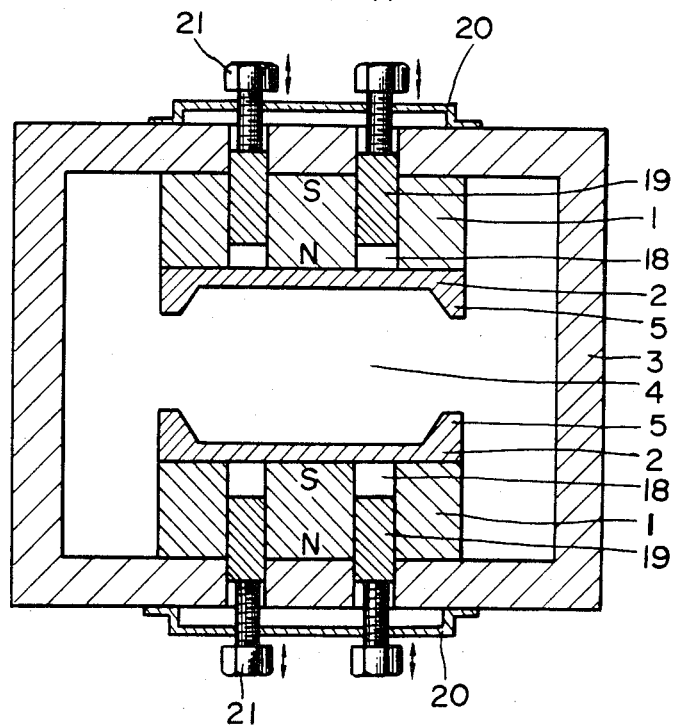
FIGS. 11 through 13 are central vertical sectional views showing further embodiments of the magnetic field-adjusting mechanism.

FIG. 11 illustrates another magnetic field-adjusting mechanism in which at least one pair of magnetic field-adjusting members made up of magnetic material and/or permanent magnet are provided on the yoke portions where the paired permanent magnets 1, 1 are mounted so that they can change their extent of contact or free-insertion by their movement in the magnetizing direction of the paired permanent magnets 1, 1.

As magnetic material of the above, these are suitable, soft magnetic material such as structural carbon steel or electromagnetic soft iron, and magnetic shunt alloys such as 30Ni-Fe or Ni-Cr-Fe. The foregoing magnetic material adjusts the extent of shunting the flux of the permanent magnet 1 thereby permitting fine adjustment of the strength of magnetic field within the air gap 4. Specifically, in the case of use of magnetic shunt alloy, the extent of flux shunt is adjusted in response to a variation in ambient temperature about the device, so that a more stable magnetic field can be obtained. In the case of use of permanent magnet as the magnetic field-adjusting member, it has the effect of changing the substantial mass of each of the paired permanent magnets 1, 1, so that the strength of magnetic field within the air gap 4 can be adjusted finely.

In the foregoing adjusting mechanism, the magnetic field-adjusting member does not necessarily come into contact with the permanent magnet 1 and come to a free-inserted state thereinto. A similar effective function can also be realized by changing the extent of contact or free-insertion with respect to the yoke portion where the permanent magnet 1 is provided.

Of course, the manner and extent of contact and free-insertion of the magnetic field-adjusting member made up of soft magnetic material, magnetic shunt alloy, permanent magnet, etc., may be selected appropriately depending upon the size and magnetic characteristic of the permanent magnet, the extent of the air gap, etc.

In FIG. 11, plural holes 18 are bored in the permanent magnet 1 from the yoke 3 toward the magnetic pole segment, into each hole 18 the rod-like soft magnetic material 19 is inserted so that its outer peripheral face is in contact with the inner peripheral face of the hole 18, a screw support 20 is fixed on the upper face of the yoke 3 as to extend over the holes of the yoke 3, and an adjusting bolt 21 threaded through the screw support 20 is provided fixedly on its point with the soft magnetic material 19. By adjusting the extent of vertical movement, as viewed in the direction, of the soft magnetic material 19, the degree of flux generation into the air gap 4 is regulated, thereby providing stably a favourable, uniform magnetic field.

Figure 12:
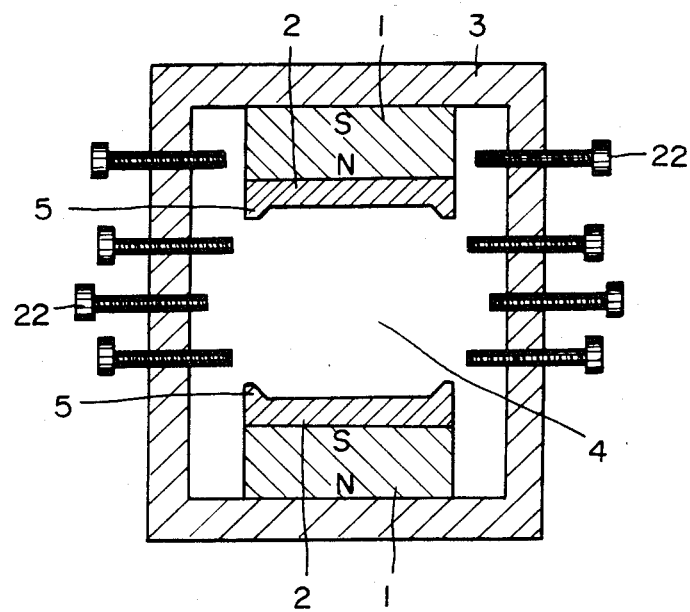

The magnetic field-adjusting mechanism shown in FIG. 12 is characterized in that in order to enlarge the area of uniform magnetic field within the air gap 4, plural magnetic field-adjusting bolts 22 made of magnetic material are provided, each of which projects from the yoke 3 and intrudes into the air gap 4 of the magnetic circuit so that the extent of intrusion is adjustable.

Specifically, the magnetic field-adjusting bolts 22 are threaded through the outer periphery of the yoke 3 parallelly with respect to the opposing faces of the magnetic pole segments 2 at spots corresponding to an upper, middle and lower portions of the air gap 4 and at a spot corresponding to a gap between the permanent magnet 1 and the yoke 3 as to intrude into the inside. Thus, by turning the bolts as to move laterally as viewed in the drawing, the extent of projection/intrusion into air gap can be adjusted.

The foregoing magnetic field-adjusting bolt 22 has the function of shunting the flux generated in the air gap 4 and the like toward the yoke 3. Thus, by appropriately selecting the extent of projection/intrusion into the air gap 4 and the like, the area of uniform magnetic field within the air gap 4 can be enlarged.

The shape, size, installation spot and number of the magnetic field-adjusting bolts, the projection/intrusion-degree adjusting mechanism, etc. can be selected appropriately depending upon the structure of the magnetic field-generating device, the size and magnetic characteristic of the permanent magnet, the extent of the air gap, etc.

Figure 13:
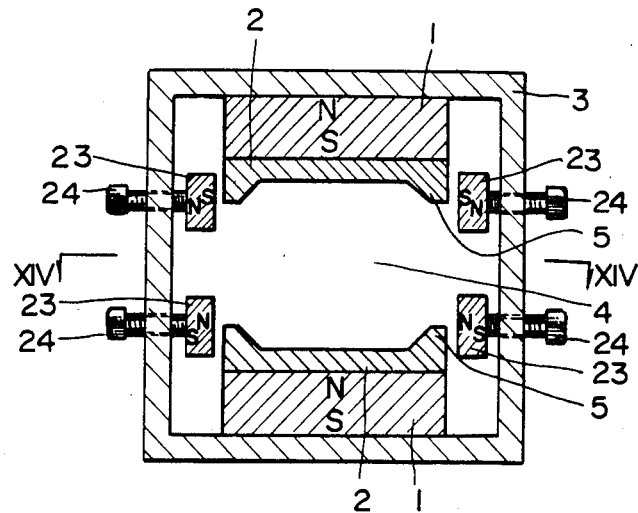
Figure 14:
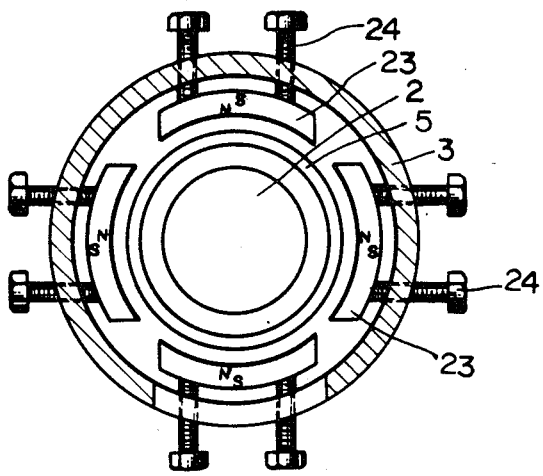
FIG. 14 is a sectional view taken along line XIV—XIV in FIG. 13.

The magnetic field-adjusting mechanism shown in FIGS. 13 and 14 is characterized in that a magnetic field-adjusting permanent magnet is positioned inside the yoke as to be movable toward and away from a magnetic pole segment.

In these drawings, on the inner peripheral face of the yoke 3 adjacent the outer periphery of the annular projection 5 of each magnetic pole segment 2, annular leakage flux-repelling permanent magnets 23 made of bow-like permanent magnets are provided at four spots mutually spaced by 90°. Each magnet 23 is loosely coupled to the points of bolt-like non-magnetic moving-extent adjusting bolts 24 threaded through the yoke 1 from its outer peripheral face toward the center. Thus, by turning the moving-extent adjusting bolts 24 the permanent magnet 23 is movable toward or away from the outer peripheral portion of the associated magnetic pole segment 2.

On the inner peripheral face of the bow-like leakage flux-repelling permanent magnet 23 positioned in opposition to the outer periphery of the annular projection 5 of each magnetic pole segment 2, a magnetic pole is created whose polarity is the same as that of the corresponding magnetic pole segment 2. That is, in these drawing, the leakage flux-repelling permanent magnet 23 adjacent the outer periphery of the upper magnetic pole segment 2 whose opposing face is of S-polarity, is S-polarity on its inner peripheral face and N-polarity on its outer peripheral face, whereas the leakage flux-repelling permanent magnet 23 positioned in opposition to the outer periphery of the lower magnetic pole segment 2 is N-polarity on its inner peripheral face.

In the foregoing structure, the magnetic flux originated from the magnetic pole segments 2, 2 is converged by the leakage flux-repelling permanent magnet 23 provided about the outer peripheral portions of the annular projection 5 and magnetic pole segment 2 in the same direction as the magnetizing direction of permanent magnets 1, 1, thereby to create a magnetic field, thus, the leakage flux decreases and an excellently uniform magnetic flux can be obtained within the air gap 4.

Figure 14A:
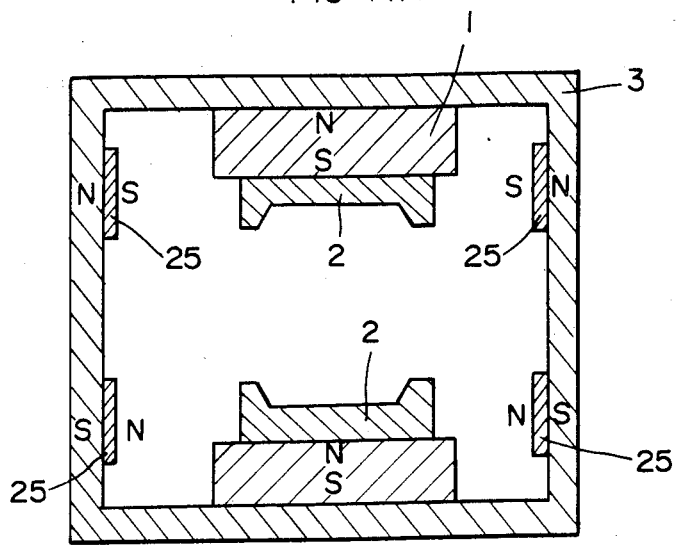
FIG. 14A is a central vertical sectional view showing a still further embodiment of the mechanism shown in FIG. 13.

As shown in FIG. 14A, if a leakage flux-repelling permanent magnet 25 is secured on the inner peripheral face of the yoke 3 and its polarity is made identical to that of the corresponding magnetic pole segment 2, a proper and appreciable effect can be obtained.

In the respective structures described hereinabove, though the leakage flux-repelling permanent magnets 13, 24 and 25 (see FIGS. 5, 6, 13 and 14) and the permanent magnets employed as the magnetic field-adjusting members (see FIG. 11), other than the pair of permanent magnets 1, 1, may be made of ferrite magnet, Alunico magnet, or rare earth magnet, similarly to the case of the paired permanent magnets 1, 1, it is preferable to employ Fe-B-R series permanent magnet in consideration of miniaturization of the device and the like. Further, in any case of the foregoing magnetic field-adjusting mechanisms, the mechanism may be removed after the adjusting and assembling process has been completed or added each time it is required in view of maintenance and management.

Besides the foregoing several magnetic field adjusting mechanisms, it is also effective in the case of very fine adjustment of the magnetic field to coat each opposing face of the paired magnetic pole segments 2 with an appropriate amount of known magnetic paint, containing magnetite, maghemite, chromic dioxide, cobalt series iron oxide, metallic magnetic powder, etc., which is known as the magnetic recording medium and produced by scattering magnetic particles into a binder solvent.

Figure 1C:
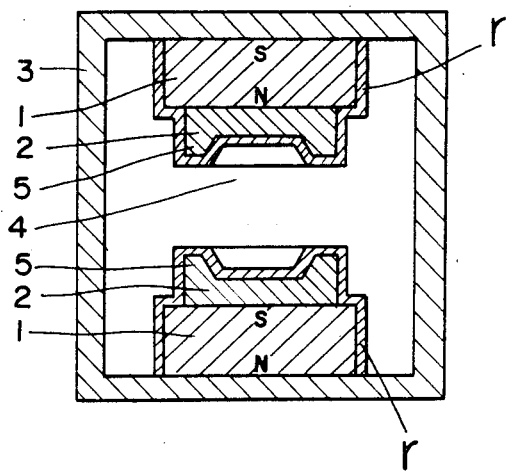

Further, a variation of the magnetic field strength resulting from a variation in temperature of the permanent magnet must be taken into consideration, which is caused owing to a variation of room temperature, heating of shim coils for compensation of magnetic field, etc. For example, as shown in FIG. 1C, it is preferable to surround the magnetic pole segments 2, permanent magnets 1, yoke 3, etc. by various heat insulating material r, made of expandable plastic such as urea series, phenole or polyurethan, fibre group such as rubber or felt, natural material such as cork carbide, metallic thin film such as asbestos, tack wool, glass fiber or aluminum sheet, fire brick, plastic refractory material, etc.

Further, in order to make easy removal of very fine magnetic dust and the like and for easy maintenance and management, it is also effective to provide detachably a non-magnetic cover made of stainless steel and the like on at least the magnetic pole segment portion.

It is also possible to make easy assembling of the heavy magnetic field generating device, leveling and adjusting of the magnetic pole segment, etc. by dividing into plural pieces in at least one plane orthogonal to the central axis of the paired magnetic pole segments within an extent not harming the magnetic coupling.

Apparently, any combination of the foregoing measures are all effective in achieving the objects of the present invention, thus, an exceedingly uniform, stable magnetic field can be created within the air gap by selecting and assembling appropriately these measures depending upon the magnetic characteristic of the permanent magnet, the extent of the air gap, etc., and the magnetic field-generating device of easy maintenance and management can be provided.

Figure 15:
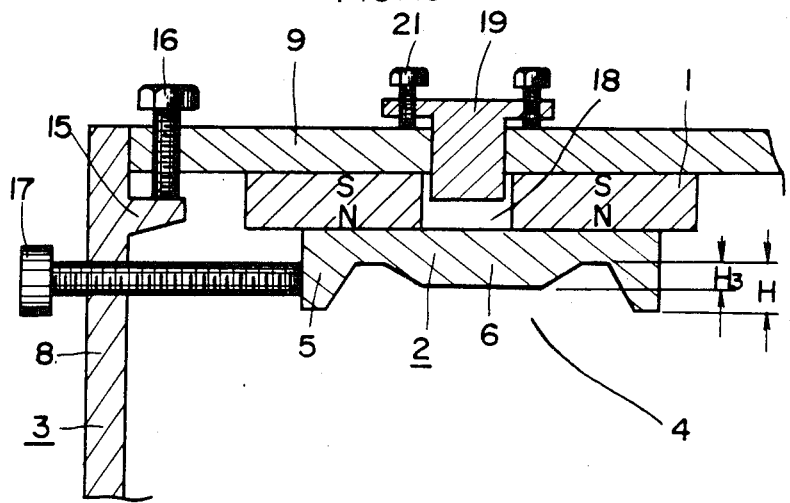
FIG. 15 is a sectional view showing a further embodiment of the magnetic field-generating device according to the present invention.

The magnetic field-generating device shown in FIG. 15 is the one embodiment utilizing effectively the foregoing respectively measures, which has produced a highly uniformed magnetic field of 1.5 kG ( 0.15 T) in field strength and $2 \times 10^{-4}$ or less in uniformity inside a spherical space of 300 mm in diameter within the gap of 630 mm in interpole segment distance.

In this drawing, the symbol 1 indicates the disk-like permanent magnet of 1300 mm in outer diameter and 105 mm in thickness, made of Fe-B-R series magnet of 35 MGOe (280 kJ/m$^3$) in $(BH)_{max}$, and containing 15 atomic % of Nd, 8 atomic % of B, and the remainder of substantial Fe.

In the center portion of the disk-like permanent magnet 1 the hole 18 of 340 mm in inner diameter is formed which is for permitting free-insertion of the rod-like magnetic field adjusting member 19 made of structural carbon steel, hereinafter described.

The symbol 2 indicates the disk-like magnetic pole segment of 1150 mm in outer diameter, having the annular projection 5 of a trapezoid in section with 850 mm in inner diameter and 94 mm in height (H), and formed in the center portion with the convex projection 6 of a trapezoid in section with 17 mm in height ($H_3$).

The symbol 3 indicates the cylinder yoke with top and bottom of 1900 mm in outer diameter and 1375 mm in height, composed of the pair of disk-like portions 9, 9 and the cylinder-like yoke portion 8.

The disk-like yoke portion 9 is equipped on the inner face with the foregoing permanent magnet 1 and supports in the center portion the magnetic field-adjusting member 19 by adjusting bolts 21 in the contacted state so that the member 19 can be adjusted in its extent of free-insertion into the center hole 18 of the permanent magnet 1. The disk-like yoke portion 9 is supported by the adjusting bolt 16 abutting on the marginal projection 15 formed on the inner periphral face of the cylinder-like yoke portion 8 so that by turning the bolt 16 it can move in the axial direction of the cylinder-like yoke portion 8.

The symbol 17 indicates the non-magnetic moving-extending adjusting bolt to shift the magnetic pole segment 2 parallelly with respect to the opposing face of the magnetic pole segment, which actually is disposed in three spots of the cylinder-like yoke portion 8 mutually separately by an internal of 120°.

Employing the foregoing structure and through adjustment of the magnetic field by the effective use of the respective adjusting mechanisms after assembling of the magnetic field-generating device, the highly uniform magnetic field noted hereinabove has been generated. By addition of the field compensating shim coil, the degree of uniformity of the magnetic field has been improved further to $1 \times 10^{-5} - 2 \times 10^{-5}$, whereby the distinct temographic image has been obtained.

What is claimed is:

1. In a magnetic field-generating device which is used in nuclear magnetic resonance-computerized tomography and which includes a yoke and a pair of permanent magnets mounted in said yoke so as to leave an air gap therebetween that contains a magnetic field, said air gap being sufficiently large to enable a portion of a human body to be positioned therein, said pair of permanent magnets being magnetized in the same direction such that the facing surfaces thereof have opposite polarities, the improvement wherein a magnetic pole segment is positioned on the facing surface of each of said permanent magnets, each magnetic pole segment having a flat surface which faces the corresponding flat surface of the other magnetic pole segment and an annular projection which extends away from the flat surface, said magnetic pole segments providing a three-dimensionally uniform magnetic field in the air gap between said permanent magnets and wherein said permanent magnets provide an energy product $(BH)_{max}$ of not less than 30 $MGO_e$(240 kJ/m$^3$).

2. In a magnetic field-generating device which is used in nuclear magnetic resonance-computerized tomography and which includes a yoke and a pair of permanent magnets mounted in said yoke so as to leave an air gap therebetween that contains a magnetic field, said air gap being sufficiently large to enable a portion of a human body to be positioned therein, said pair of permanent magnets being magnetized in the same direction such that the facing surfaces thereof have opposite polarities, the improvement wherein a magnetic pole segment is positioned on the facing surface of each of said permanent magnets, each magnetic pole segment having a flat surface which faces the corresponding flat surface of the other magnetic pole segment, an annular projection which extends away from the flat surface, and a convex projection which is centered within the annular projection and extends away from the flat surface, said magnetic pole segments providing a three-dimensionally uniform magnetic field in the air gap between said permanent magnets.

3. A magnetic field-generating device as set forth in claims 1 or 2, wherein the flat surfaces of said magnetic pole segments are separated by a distance $L_g$, wherein each magnetic pole segment is circular and has an outer diameter $D_1$, wherein each annular projection has an inner diameter $D_2$ and a height H, and wherein $$D_2 \geq \tfrac{1}{3} \cdot D_1$$

and $$H \leq \tfrac{1}{4} \cdot L_g.$$

4. A magnetic field-generating device as set forth in claims 1 or 2, wherein each of said annular projections has trapezoidal cross section.

5. A magnetic field-generating device as set forth in claims 1 or 2, wherein each of said annular projections has a triangular cross section.

6. A magnetic field-generating device as set forth in claims 1 or 2, wherein each of said annular projections has an inner surface which is curved.

7. A magnetic field-generating device as set forth in claim 2, wherein each annular projection has a height H, wherein each convex projection has a height $H_3$, and wherein $$H_3/H = 1/100 \text{ to } \tfrac{1}{3}.$$

8. A magnetic field-generating device as set forth in claim 2, wherein each convex projection is generally disc-shaped and has a cross section which is substantially trapezoidal.

9. A magnetic field-generating device as set forth in claim 2, wherein each convex projection is composed of a plurality of disks on top of one another, each higher disk having a smaller diameter than the disk therebelow.

10. A magnetic field-generating device as set forth in claim 2, wherein said pair of permanent magnets provide an energy product $(BH)_{max}$ of not less than 30 $MGO_e$(240 kJ/m$^3$).

11. A magnetic field-generating device as set forth in claims 1 or 2, wherein said yoke comprises a cylindrical body portion, a top wall and a bottom wall, and wherein said permanent magnets are respectively mounted on said top and bottom walls.

12. A magnetic field-generating device as set forth in claims 1 or 2, wherein said yoke comprises a top plate, a bottom plate and a plurality of rods connected between said top and bottom plates, and wherein said permanent magnets are respectively mounted on said top and bottom plates.

13. A magnetic field-generating device as set forth in claims 1 or 2, wherein said yoke comprises a quadrilateral frame body.

14. A magnetic field-generating device as set forth in claims 1 or 2, including a leakage flux-repelling permanent magnet positioned around each magnetic pole segment.

15. A magnetic field-generating device as set forth in claims 1 or 2, wherein said yoke has an inner face, and including a leakage flux-repelling permanent magnet provided on said inner face.

16. A magnetic field-generating device as set forth in claims 1 or 2, including means for changing the distance between said magnetic pole segments.

17. A magnetic field-generating device as set forth in claims 1 or 2, including means for moving said magnetic pole segments in parallel to one another.

18. A magnetic field-generating device as set forth in claims 1 or 2, wherein said permanent magnets are mounted on respective portions of said yoke, and including magnetic field-adjusting members containing magnetic material which are adjustably mounted on said yoke portions so as to be movable in the magnetizing direction of said permanent magnets.

19. A magnetic field-generating device as set forth in claims 1 or 2, including magnetic field-adjusting members containing a magnetic material adjustably mounted on said yoke so as to be movable in and out of said air gap.

20. A magnetic field-generating device as set forth in claims 1 or 2, including magnetic field-adjusting members adjustably mounted on said yoke so as to be movable toward and away from the periphery of each magnetic pole segment.

21. A magnetic field-generating device as set forth in claims 1 or 2, including a heat insulating material surrounding said permanent magnets.

22. A magnetic field-generating device as set forth in claims 1 or 2, including a heat insulating material surrounding said magnetic pole segments.

23. A magnetic field-generating device as set forth in claims 1 or 2, including a heat insulating material surrounding said yoke.

24. A magnetic field-generating device as set forth in claims 1 or 10, including means to cool said permanent magnets.

25. A magnetic field-generating device as set forth in claim 2, wherein each convex projection includes at least one recess therein which is centered with respect to the associated annular projection.

26. A magnetic field-generating device as set forth in claims 1 or 2, wherein the yoke has two permanent magnet receiving portions, each of which projects toward the air gap so as to form a convex portion in the yoke.

* * * * *